United States Patent
Cros et al.

(10) Patent No.: US 9,771,654 B2
(45) Date of Patent: Sep. 26, 2017

(54) MULTILAYER STRUCTURE OFFERING IMPROVED IMPERMEABILITY TO GASES

(71) Applicant: Commissariat a l'energie atomique et aux ene alt, Paris (FR)

(72) Inventors: Stephane Cros, Chambery (FR); Nicole Alberola, Les Deserts (FR); Jean-Paul Garandet, Le Bourget du Lac (FR); Arnaud Morlier, Faucigny (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 141 days.

(21) Appl. No.: 14/346,890

(22) PCT Filed: Sep. 24, 2012

(86) PCT No.: PCT/EP2012/068766
§ 371 (c)(1),
(2) Date: Mar. 24, 2014

(87) PCT Pub. No.: WO2013/045393
PCT Pub. Date: Apr. 4, 2013

(65) Prior Publication Data
US 2014/0234602 A1    Aug. 21, 2014

(30) Foreign Application Priority Data

Sep. 26, 2011   (FR) ...................... 11 58570

(51) Int. Cl.
*C23C 18/14*   (2006.01)
*C23C 18/12*   (2006.01)
(Continued)

(52) U.S. Cl.
CPC ........ *C23C 18/122* (2013.01); *C23C 18/1204* (2013.01); *C23C 18/1212* (2013.01);
(Continued)

(58) Field of Classification Search
None
See application file for complete search history.

(56) References Cited

U.S. PATENT DOCUMENTS 5,051,308 A * 9/1991 Reed ................. C08J 7/123
427/489
5,472,827 A * 12/1995 Ogawa ................ G03F 7/091
257/E21.028
(Continued)

FOREIGN PATENT DOCUMENTS

CN    1445818 A    10/2003
JP    5-345383     12/1993
(Continued)

OTHER PUBLICATIONS

Machine translation of JP 2016/074222A, obtained from Industrial Property Digital Library of the JPO on Apr. 26, 2017.*
(Continued)

*Primary Examiner* — Aaron Austin
*Assistant Examiner* — Zheren J Yang
(74) *Attorney, Agent, or Firm* — Oblon, McClelland, Maier & Neustadt, L.L.P.

(57) ABSTRACT

A multilayer structure including a substrate and a first stack of a layer of $SiO_2$ and a layer of material of the $SiO_xN_yH_z$ type positioned between the substrate and the layer of $SiO_2$, in which the layer of $SiO_2$ and the layer of material of the $SiO_xN_yH_z$ type have thicknesses ($e_B$, $e_A$) such that the thickness of the layer of $SiO_2$ is less than or equal to 60 nm, the thickness of the layer of material of the $SiO_xN_yH_z$ type ($e_B$) is more than twice the thickness ($e_A$) of the layer of $SiO_2$, and the sum of the thicknesses of the layer of $SiO_2$ and of the layer of material of the $SiO_xN_yH_z$ type is between 100
(Continued)

Figure 1:
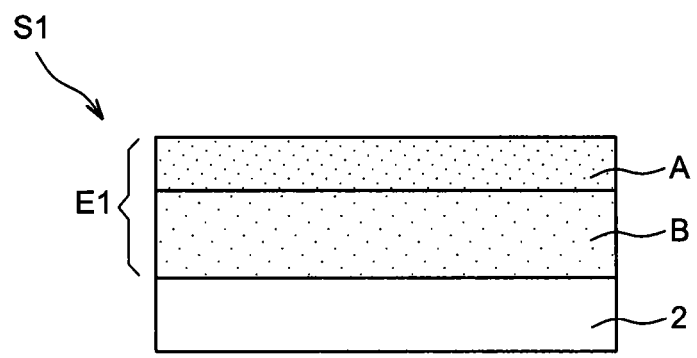

nm and 500 nm, and in which z is strictly less than the ratio (x+y)/5, and advantageously z is strictly less than the ratio (x+y)/10.

27 Claims, 3 Drawing Sheets

(51) Int. Cl.
H01L 21/02 (2006.01)
H01L 51/52 (2006.01)
H01L 31/048 (2014.01)
H01L 31/0392 (2006.01)
H01L 51/10 (2006.01)

(52) U.S. Cl.
CPC .......... C23C 18/1225 (2013.01); C23C 18/14 (2013.01); H01L 21/02222 (2013.01); H01L 31/0392 (2013.01); H01L 31/03923 (2013.01); H01L 31/048 (2013.01); H01L 31/0481 (2013.01); H01L 51/5253 (2013.01); H01L 51/5256 (2013.01); B32B 2307/7244 (2013.01); H01L 51/107 (2013.01); Y02E 10/541 (2013.01); Y10T 428/2495 (2015.01); Y10T 428/24975 (2015.01)

(56) References Cited

U.S. PATENT DOCUMENTS

| | | | | |
|---|---|---|---|---|
| 5,497,445 | A * | 3/1996 | Imoto | G02B 6/1221 385/132 |
| 5,508,368 | A * | 4/1996 | Knapp | C23C 16/0245 347/203 |
| 5,846,649 | A * | 12/1998 | Knapp | B05D 1/62 428/334 |
| 6,379,014 | B1 * | 4/2002 | Li | G02B 1/115 359/580 |
| 8,216,684 | B2 * | 7/2012 | Ito | C23C 16/345 156/330 |
| 8,754,407 | B2 | 6/2014 | Takemura et al. | |
| 2002/0034885 | A1 * | 3/2002 | Shindo | C09D 183/16 438/789 |
| 2003/0012538 | A1 * | 1/2003 | Johnson | C03C 4/0042 385/129 |
| 2003/0203210 | A1 | 10/2003 | Graff et al. | |
| 2003/0215973 | A1 * | 11/2003 | Yamazaki | H01L 21/0237 438/48 |
| 2006/0188799 | A1 * | 8/2006 | Aoki | G03G 5/08235 430/66 |
| 2007/0026243 | A1 * | 2/2007 | Iwanaga | C23C 16/308 428/446 |
| 2007/0147766 | A1 * | 6/2007 | Mattsson | C03C 3/045 385/142 |
| 2008/0138611 | A1 * | 6/2008 | Yasuzawa | B05D 7/51 428/336 |
| 2009/0029056 | A1 * | 1/2009 | Hoffmann | C23C 18/14 427/372.2 |
| 2009/0072230 | A1 * | 3/2009 | Ito | C23C 16/30 257/40 |
| 2009/0104750 | A1 * | 4/2009 | Yamazaki | H01L 21/76254 438/406 |
| 2009/0110896 | A1 * | 4/2009 | Kuramachi | C23C 16/308 428/220 |
| 2010/0089263 | A1 * | 4/2010 | Sato | B41F 9/10 101/169 |
| 2010/0151274 | A1 * | 6/2010 | Kang | B05D 3/065 428/688 |
| 2010/0166977 | A1 * | 7/2010 | Brand et al. | C08J 7/047 427/515 |
| 2011/0014796 | A1 * | 1/2011 | Hayashi | C03C 1/008 438/782 |
| 2011/0064932 | A1 * | 3/2011 | Takahashi | C23C 16/345 428/220 |
| 2011/0185948 | A1 * | 8/2011 | Uemura | H01L 21/0214 106/632 |
| 2012/0015181 | A1 * | 1/2012 | Seo | C23C 14/20 428/339 |
| 2012/0017985 | A1 * | 1/2012 | Rode | C08G 77/62 136/256 |
| 2012/0064321 | A1 * | 3/2012 | Suzuki | C08J 7/123 428/219 |
| 2012/0107607 | A1 * | 5/2012 | Takaki | C08J 7/047 428/336 |
| 2012/0156893 | A1 * | 6/2012 | Ozaki | C23C 18/1208 438/781 |
| 2012/0228641 | A1 * | 9/2012 | Thoumazet | C23C 16/0245 257/79 |
| 2012/0241889 | A1 * | 9/2012 | Takemura | H01L 51/448 257/431 |
| 2013/0001808 | A1 | 1/2013 | Cros et al. | |
| 2013/0092239 | A1 * | 4/2013 | Mori | B05D 3/067 136/263 |
| 2013/0115423 | A1 * | 5/2013 | Ii | B05D 5/00 428/141 |
| 2013/0122217 | A1 * | 5/2013 | Akagi | B05D 3/067 427/558 |
| 2013/0146860 | A1 * | 6/2013 | Toyama | H05B 33/04 257/40 |
| 2013/0164690 | A1 * | 6/2013 | Shinde | C23C 18/1216 430/324 |
| 2013/0236710 | A1 * | 9/2013 | Honda | C23C 16/483 428/212 |
| 2013/0244044 | A1 * | 9/2013 | Ito | C23C 14/48 428/446 |
| 2013/0280521 | A1 * | 10/2013 | Mori | C23C 14/0676 428/332 |
| 2013/0316182 | A1 * | 11/2013 | Mori | B05D 1/60 428/448 |
| 2014/0106151 | A1 * | 4/2014 | Mori | H01L 51/5253 428/216 |
| 2014/0117511 | A1 * | 5/2014 | Matoy | H01L 21/0214 257/639 |
| 2014/0127630 | A1 * | 5/2014 | Shinde | G03F 7/091 430/322 |
| 2014/0199544 | A1 * | 7/2014 | Naganawa | C08J 7/047 428/336 |
| 2014/0322478 | A1 * | 10/2014 | Mori | H01L 51/5246 428/76 |
| 2015/0004421 | A1 * | 1/2015 | Fujiwara | C23C 18/122 428/447 |
| 2015/0235917 | A1 * | 8/2015 | Matoy | H01L 23/3171 257/639 |
| 2015/0252222 | A1 * | 9/2015 | Ozaki | C08J 7/047 524/588 |

FOREIGN PATENT DOCUMENTS

| | | | | |
|---|---|---|---|---|
| JP | 07-206410 | | 8/1995 | |
| JP | 09-045614 | | 2/1997 | |
| JP | 2003 211579 | | 7/2003 | |
| JP | 2007237588 | A * | 9/2007 | |
| JP | 2009255040 | A * | 11/2009 | |
| JP | 2011044453 | A * | 3/2011 | |
| JP | 2011-068124 | | 4/2011 | |
| JP | 2011121298 | A * | 6/2011 | |
| JP | 2011136570 | A * | 7/2011 | ............ B32B 7/02 |
| JP | 2011146226 | A * | 7/2011 | |
| JP | 2011156752 | A * | 8/2011 | |
| JP | 2011-173057 | | 9/2011 | |
| JP | 2011-183773 | | 9/2011 | |
| JP | 2011173057 | A * | 9/2011 | |
| JP | 2011183773 | A * | 9/2011 | |
| JP | 2012-016854 | | 1/2012 | |
| JP | 2012016854 | A * | 1/2012 | |
| WO | WO2011/007543 | | 1/2011 | |
| WO | WO 2011043315 | A1 * | 4/2011 | ............ H01L 51/448 |
| WO | WO 2011062100 | A1 * | 5/2011 | ............ B32B 27/08 |

(56) References Cited

FOREIGN PATENT DOCUMENTS

WO     WO 2011/074440 A1     6/2011
WO     WO2012/008277     1/2012
WO     WO 2012/014653 A1 *     2/2012

OTHER PUBLICATIONS

Preliminary Search Report issued May 14, 2012 in French Patent Application No. FR 1158570 (with English translation of Category of Cited Documents).
S. Bec, A. Tonck et al., "A simple guide to determine elastic properties of films on substrate from nanoindentation experiments", Philosophical Magazine, vol. 86, Nos. 33-35, 2006, pp. 5347-5358.
C. Pailler-Mattei, et al."In vivo measurements of the elastic mechanical properties of human skin by indentation tests", Medical Engineering & Physics, 30, 2008, pp. 599-606.
Combined Office Action and Search Report issued Jul. 20, 2015 in Chinese Patent Application No. 201280058112.1 (with English translation and English translation of category of cited documents).
U.S. Appl No. 14/440,264, filed May 1, 2015, Leroy, et al.
Prager, L., et al., "Conversion of Perhydropolysilazane into a SiOx Network Triggered by Vacuum Ultraviolet Irradiation: Access to Flexible, Transparent Barrier Coatings", Chem. Eur. J., vol. 13, pp. 8522-8529, (2007) (XP055026020).
International Search Report Issued Oct. 26, 2012 in PCT/EP12/068766 Filed Sep. 24, 2012.
Office Action issued Oct. 31, 2016, in Japanese Patent Application No. 2014-531264, with English Translation.

* cited by examiner

MULTILAYER STRUCTURE OFFERING IMPROVED IMPERMEABILITY TO GASES

TECHNICAL FIELD AND PRIOR ART

The present invention relates to a multilayer structure offering improved impermeability to gases.

It is known to produce a deposit of a thin layer, typically between 100 nm and several hundred nm thick, of a dense inorganic material on a thick polymer substrate, typically 10 µm to several hundred µm thick, for example a substrate made of PET (Polyethylene terephthalate) in order to improve its impermeability to gases. This technique is widely used in the field of food packaging to improve food conservation.

However, this inorganic deposit causes mechanical stresses, notably relating to the differentials of mechanical and thermal properties between the inorganic layer and the polymer, i.e. the difference of elastic moduli, of deformation capacities, the thermal expansion difference, etc. These stresses cause damage to the deposited inorganic layer, the effect of which is to limit its functional properties. Cracks may then appear, which reduce the gas barrier properties of the assembly formed by the polymer substrate and the inorganic deposit.

Document US 2003/0203210 describes a method consisting in producing alternating stacks of inorganic layers and polymer layers, which are between 1 µm and several µm thick, on the thick polymer substrate. The alternation of inorganic and organic layers enables the faults of each inorganic layer to be decorrelated, and by this means to improve substantially thus the gas barrier properties. The polymer substrate covered in this manner has gas barrier properties which are sufficient to protect devices which are highly sensitive to the atmosphere, such as Organic Light-Emitting Diodes (OLEDs). However, such alternating structures are relatively costly to produce, making them unsuitable for low-cost applications such as, for example, photovoltaic applications.

DESCRIPTION OF THE INVENTION

One aim of the present invention is consequently to offer a device with a structure having improved gas barrier properties compared to those of the structures of the state of the art, and a method for producing such a structure having a lower production cost than the existing methods.

The aim set out above is attained by a multilayer structure formed of a substrate, at least one layer made of a material of the $SiO_xN_yH_z$ type, and at least one layer of $SiO_2$, where the layer of material of the $SiO_xN_yH_z$ type is intended to be interposed between the substrate and the layer of $SiO_2$. The layer of the $SiO_xN_yH_z$ type forms a mechanical accommodation layer between the substrate and the layer of $SiO_2$, and enables the stresses between the substrate and the layer of $SiO_2$ to be adjusted, which prevents or limits the deterioration of the layer of $SiO_2$, thereby improving the gas impermeability of the layer of $SiO_2$.

In other words, a layer forming a mechanical interface between the substrate and the layer of $SiO_2$, which is thicker and less rigid than the layer of $SiO_2$, is produced, which prevents the layer of $SiO_2$ from fracturing.

The substrate is for example a polymer substrate, which is preferably transparent.

This bilayer stack may be repeated, and such a stack offers outstanding gas barrier properties, which are far superior to those expected by the sum of the gas barrier properties of two bilayer stacks.

In another example embodiment a layer of another material may be deposited on the bilayer structure, for example made of polymer.

The structure according to the invention is obtained, for example, by the conversion by VUV and UV irradiation of a precursor of the liquid perhydropolysilazane (PHPS) type.

Very advantageously, the layer of $SiO_2$ and the layer of material of the $SiO_xN_yH_z$ type are formed simultaneously and this formation occurs under specific oxygen- and water-depleted conditions.

The subject-matter of the present invention is then a multilayer structure including a substrate, and a first stack of a layer of $SiO_2$ and a layer of material of the $SiO_xN_yH_z$ type positioned between the substrate and the layer of $SiO_2$, in which the layer of $SiO_2$ and the layer of material of the $SiO_xN_yH_z$ type have thicknesses such that the thickness of the layer of $SiO_2$ is less than or equal to 60 nm, the thickness of the layer of material of the $SiO_xN_yH_z$ type is more than twice the thickness of the layer of $SiO_2$, and the sum of the thicknesses of the layer of $SiO_2$ and of the layer of material of the $SiO_xN_yH_z$ type is between 100 nm and 500 nm, and in which z is strictly less than the ratio $(x+y)/5$, and advantageously z is strictly less than the ratio $(x+y)/10$.

Very advantageously, the value of x decreases from the interface between the layer of material of the $SiO_xN_yH_z$ type and the layer of $SiO_2$ towards the substrate, and the value of y increases from the interface between the layer of material of the $SiO_xN_yH_z$ type and the layer of $SiO_2$ towards the substrate. x preferably varies between 2 and 0 and/or y varies between 0 and 1.

According to another advantageous characteristic the material of the layer of $SiO_2$ has a Young's modulus of greater than or equal to 30 GPa, and the layer of material of the $SiO_xN_yH_z$ type has a Young's modulus of less than or equal to 20 GPa.

The stack may have a refractive index of greater than 1.5.

According to another advantageous characteristic the stack or stacks is/are obtained by conversion of an inorganic precursor of the perhydropolysilazane type, where the stack has a transmittance corresponding to the Si—H bond of greater than 80%, advantageously greater than 90%, of the transmittance of the Si—H bond of the inorganic precursor of the perhydropolysilazane type before conversion, measured by infrared reflectance spectrometry in the case of a substrate made of polymer material. Or the stack or stacks is/are obtained by conversion of an inorganic precursor of the perhydropolysilazane type, where the stack has an absorbance corresponding to the Si—H bond of less than 20%, advantageously less than 10%, of the absorbance of the Si—H bond of the inorganic precursor of the perhydropolysilazane type before conversion, measured by infrared transmission spectrometry in the case of a silicon substrate.

The layer of $SiO_2$ and the layer of a material of the $SiO_xN_yH_z$ type are, for example, made of amorphous materials.

The substrate is made, for example, of a polymer material.

The multilayer structure may include a layer of polymer material on the layer of $SiO_2$ of the first stack on the face opposite the one in contact with the layer made of material of the $SiO_xN_yH_z$ type.

According to another example embodiment, the multilayer structure may include n stacks, where n is a positive integer greater than or equal to 1, where each stack includes a layer of $(SiO_2)_i$ and a layer of a material of the $SiO_{xi}N_{yi}H_{zi}$ type, where i is a positive integer of between 1 and n, where the layers of $(SiO2)_i$ and of a material of the $SiO_{xi}N_{yi}H_{zi}$ type of each stack have thicknesses such that the thickness of the layers of $(SiO_2)_i$ is less than or equal to 60 nm, the thickness of the layers of the material of the $SiO_{xi}N_{yi}H_{zi}$ type is more than twice the thickness of the layer of $(SiO_2)_i$, and the sum of the thicknesses of the layer of $(SiO_2)_i$ and of the layer of the material of the $SiO_{xi}N_{yi}H_{zi}$ type is between 100 nm and 500 nm, and in which $z_i$ is strictly less than the ratio $(x_i+y_i)/5$, and advantageously $z_i$ is strictly less than the ratio $(x_i+y_i)/10$, where $x_i$, $y_i$ and $z_i$ may or may not be identical for the different values of i. The multilayer structure can also include at least one layer made of polymer material positioned between the layer of $(SiO_2)_i$ of a stack and the layer of material of the $SiO_{xi}N_{yi}H_{zi}$ type of the stack which follows directly. For example, the multilayer structure includes n−1 layers made of polymer material, where each of the layers made of polymer material is positioned between two stacks.

Another subject-matter of the present invention is a method for producing a multilayer structure according to the invention, including:

a) deposition on a substrate of a liquid inorganic precursor of the perhydropolysilazane type, b) conversion by irradiation by VUV radiation with a wavelength of less than or equal to 220 nm and an ultraviolet radiation with a wavelength of greater than or equal to 220 nm in an atmosphere with an oxygen content of greater than 10 ppm and less than 500 ppm and a water content of less than or equal to 1,000 ppm, so as to form a stack of a layer of $SiO_2$ and a layer of a material of the $SiO_xN_yH_z$ type.

The production method may include step c) of deposition of a layer of polymer material after step b).

According to another example embodiment, the production method includes the repetition of steps a) and b) or a), b) and c).

Another subject-matter of the present invention is a method for producing a multilayer structure, including:

a') deposition on a substrate of a liquid inorganic precursor of the perhydropolysilazane type on the substrate, b') conversion by irradiation by ultraviolet radiation with a wavelength of greater than 220 nm in an atmosphere having an oxygen content and a water content of less than 10 ppm, c') deposition on the layer formed in step b' of a liquid inorganic precursor of the perhydropolysilazane type on the substrate, d') conversion by irradiation by VUV radiation with a wavelength of less than or equal to 220 nm in an atmosphere having an oxygen content of greater than 10 ppm and less than 500 ppm.

BRIEF DESCRIPTION OF THE ILLUSTRATIONS

Figure 2:
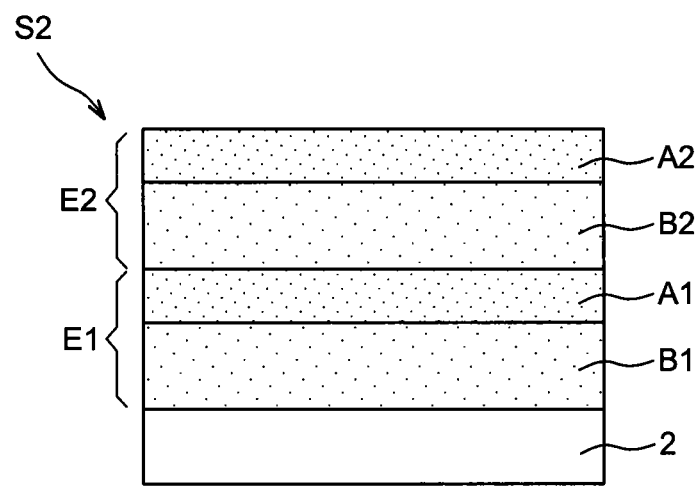
Figure 3:
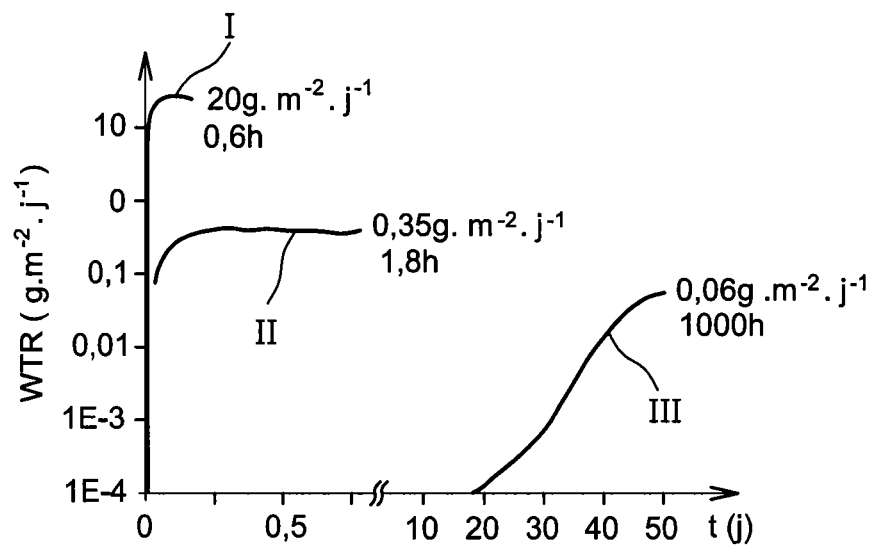
Figure 4:
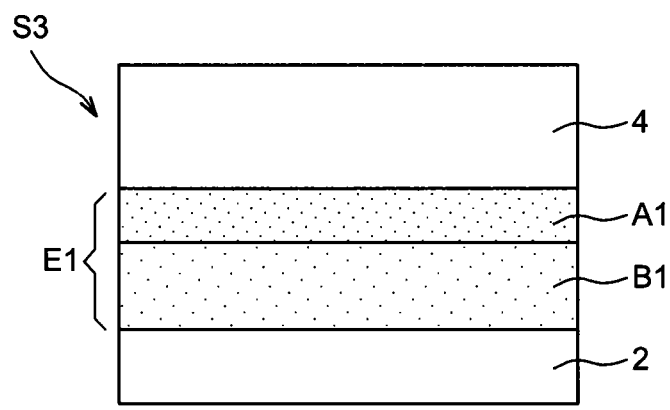
Figure 5:
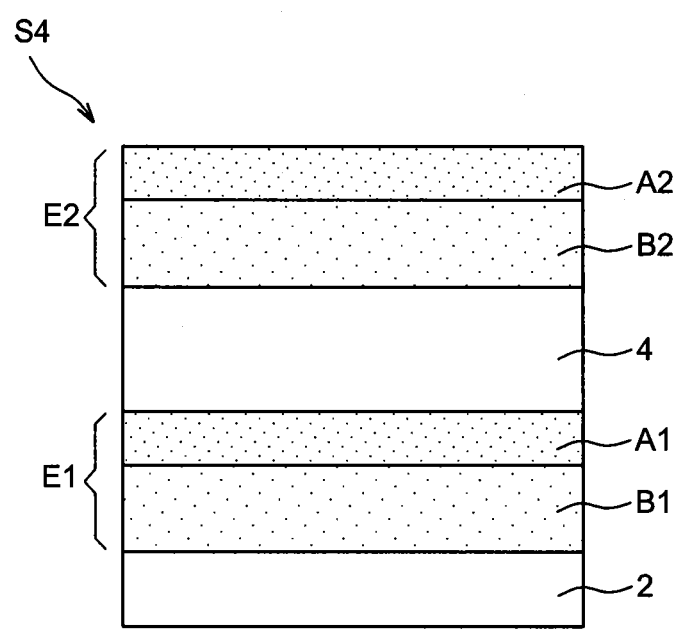

The present invention will be better understood using the description which follows and the appended illustrations, in which:

FIG. 1 is a schematic side view representation of an example of a structure according to the invention, FIG. 2 is a schematic side view representation of another example of a structure, FIG. 3 is a graphical representation of the measurement of the water flow of the structure of FIG. 2, as a function of the time in days, FIG. 4 is a schematic side view representation of another example of a structure according to the invention, FIG. 5 is a schematic side view representation of a variant of the structure of FIG. 4.

DETAILED DESCRIPTION OF PARTICULAR EMBODIMENTS

In FIG. 1 a structure S1 according to the invention may be seen including a substrate 2 and a stack E1 of a first layer A made of $SiO_2$ and a second layer B made of a material of the $SiO_xN_yH_z$ type.

Layers A and B are separate from one another, and are made of different materials.

Substrate 2 is, for example, a polymer material, for example of the polyester type such as PET (polyethylene terephthalate), PEN (polyethylene naphthalate), or of the polyolefine type such as PE (polyethylene), PP (polypropylene), polyamide, etc. Other materials may be envisaged as the substrate, for example monocrystalline or amorphous silicon, or glass.

The substrate is preferably transparent.

Second layer B is deposited directly on substrate 2 and is interposed between substrate 2 and first layer A.

The thickness of first layer A is $e_A$, and its Young's modulus is $M_A$, and the thickness of second layer B is $e_B$, and its Young's modulus is $M_B$.

The thicknesses of first layer A and second layer B are such that:

$e_A \leq 60$ nm $e_B \geq 2e_A$;

100 nm$<e_A+e_B<$500 nm.

In addition, the coefficients x for oxygen, y for nitrogen and z for hydrogen of the chemical formula of the material of layer B made of $SiO_xN_yH_z$ are such that $0<z<(x+y)/5$, and advantageously such that $0<z<(x+y)/10$.

Coefficients x and y preferably vary from the interface between layer A and layer B in the direction of the interface between the substrate and layer B. x decreases from the interface between layer A and layer B in the direction of the Interface between the substrate and layer B, preferably from 2 to 0; y increases from the interface between layer A and layer B in the direction of the interface between the substrate and layer B, preferably from 0 to 1.

The Young's moduli of first layer A and second layer B are advantageously such that:

MA>30 GPa, and $M_B$<20 GPa.

These advantageous conditions for the Young's moduli of layers A and B enable the gas barrier properties to be improved still further.

The Young's moduli of layers A and B can be measured using the techniques described in the documents "*A simple guide to determine elastic properties of films on substrate from nanoindentation experiments*", S. Bec, A. Tonck and J Loubet, in *Philosophical Magazine*, Vol. 86, Nos. 33-35, 21 Nov.-11 Dec. 2006, pp 5347-5358 and in the document "*In vivo measurements of the elastic mechanical properties of human skin by indentation tests*", in *Medical Engineering & Physics*, 30(2008) pp 599-606.

The refractive index of structure S1 is preferably greater than 1.5.

The materials of layers A and B may be amorphous.

Since second layer B is thicker than first layer A and since it is less rigid than layer A, due to its lower Young's modulus, layer B enables the stresses between first layer A and substrate 2 to be adapted, and by this means enables fracturing of first layer A to be prevented. In addition, second layer B allows a limitation of the deformation of the structure formed by substrate 2 and the bilayer structure relating to the phenomenon of differential deformation between first layer A and substrate 2, which could lead to a curvature of the assembly.

First layer A made of $SiO_2$ due to its density naturally offers gas impermeability properties. Due to the presence of second layer B which forms a mechanical adaptation layer, the gas impermeability properties of first layer A are not degraded, or only slightly degraded.

The quantity of Si—H bonds remaining after conversion of the PHPS in layers A and B is very low. This characteristic may be measured using infrared transmission spectrometry; the band corresponding to the Si—H bonds is between 2,100 and 2,300 $cm^{-1}$ (wave number). The absorbance corresponding to the Si—H bond of the structure of the invention is less than 20%, preferably less than 10%, of the absorbance of the Si—H bond of the PHPS before treatment. This transmission absorbance may be measured when the deposition is accomplished on a substrate which is transparent to infrared radiation, such as a silicon substrate. This small quantity of Si—H may also be detected when the structure is deposited on a polymer substrate. The measurement is then made in reflectance mode, and the transmittance in wave number range 2,100-2,300 $cm^{-1}$ is greater than 80%, and preferably greater than 90%.

We shall now describe an example of a method of single-step production of structure S1.

A face of substrate 2 is covered with a liquid inorganic precursor, for example of the perhydropolysilazane type.

The precursor is then irradiated by means of far ultraviolet radiation or ("VUV: Vacuum Ultraviolet") of wavelength of less than or equal to 220 nm and a UV radiation of wavelength of greater than or equal to 220 nm.

For example, the irradiation is applied by means of a low-pressure mercury lamp combining a VUV wavelength of 185 nm and a UV wavelength of 254 nm. Deposition and the conversion are accomplished, for example, at ambient temperature. The dose received for the radiation at 185 nm is, for example, less than 20 joules/$cm^2$.

With the advantageous manner described above, layers A and B are produced simultaneously in one method and one step. To this end, the conversion step is accomplished in an oxygen- and water-depleted environment in order to limit the thickness of layer A and the conversion of layer B, which enables the characteristics of the layers mentioned above to be obtained.

The depleted environment has:
an oxygen content of less than 500 ppm,
a water content of less than or equal to 1,000 ppm.

Alternatively, the method may be implemented in two steps: in a first step a layer of a liquid inorganic precursor, for example of the perhydropolysilazane type, is deposited on the substrate; this layer is then subjected to UV radiation of wavelength of greater than 220 nm with the negligible presence of oxygen and water, i.e. less than ppm. In a second step another layer of the same inorganic precursor as that of the first layer is deposited on the first layer; this second layer is subjected to VUV radiation at a wavelength of greater than 220 nm and in the presence of oxygen; the oxygen concentration is then between 10 ppm and 500 ppm.

In FIG. 2 an example of a structure offering remarkable gas barrier properties may be seen.

Structure S2 includes a substrate 2, a first stack E1, which is identical to that of structure S1, and a stack E2 including a layer of $SiO_2$ A2 and a layer B2 made of a material of the $SiO_{x'}N_{y'}H_{z'}$ type. Layer B2 is deposited directly on first layer A1 of structure S1 as described above in relation with FIG. 1. The thicknesses of layers A2 and B2 are such that:

$e_{A2} \leq 60$ nm
$e_{B2} \geq 2e_{A2}$
100 nm $< e_{A2} + e_{B2} <$ 500 nm.

Coefficients x' for oxygen, y' for nitrogen and z' for hydrogen of the chemical formula of the material of layer B2 are identical or different to coefficients x, y, z of the material of layer B1 made of $SiO_xN_yH_z$ respectively. As with layer B1, x', y' and z' are such that $z' < (x'+y')/5$, and advantageously such that $z' < (x'+y')/10$. In addition, x' and y' preferably vary from the interface between layer A2 and the layer B2 in the direction of the substrate. x' decreases from the interface between layer A2 and layer B2 in the direction of the substrate, preferably from 2 to 0; y' increases from the interface between layer A2 and layer B2 in the direction of the substrate, preferably from 0 to 1.

The thicknesses of layers A2 and B2 and their Young's moduli may be equal to those of layers A1 and B1 respectively, or different.

Like layer B1, layer B2 enables the entegrity of layer A2 to be preserved, and therefore enables its functional properties to be optimised. In addition, during the deposition of layers A2 and B2, layer B1 enables the mechanical problems to be limited, and in particular the curvature of the structure formed by substrate 2 and the two bilayer stacks.

Structure S2 demonstrates remarkable gas barrier properties, as is shown by the graphical representation of FIG. 3. This shows the measurement of the water flow, in $g \cdot m^{-2} \cdot jour^{-1}$, designated WVTR, as a function of the time in days.

These measurements are made for three stacks:
I: a substrate made of PET polymer only,
II: structure S1 according to the invention, with $e_A = 50$ nm and $e_B = 200$ nm,
III: structure S2 according to the invention, with $e_{A1} = e_{A2} = 50$ nm and $e_{B1} = e_{B2} = 200$ nm.

In addition to FIG. 3, table 1 below lists the barrier properties and refractive indices of structures S1 and S2 in comparison with a structure formed of a PET substrate and a layer of silica only, which is 250 nm or 600 nm thick, produced by hydrolysis at temperature (80° C.) of perhydropolysilazane or of a 50 nm layer of silica obtained by VUV conversion. In this table the barrier properties are expressed in terms of the "Barrier Improvement Factor" (BIF), which expresses the improvement factor compared to a PET-only substrate. Water and helium permeation measurements were made.

| Sample | BIF He | BIF water | BIF oxygen | Refractive index |
|---|---|---|---|---|
| PET | 1 | 1 | 1 | — |
| S1 | 3.5 +/− 0.5 | 60 | 40 | 1.62 |
| S2 | 7.5 +/− 0.5 | 333 | N.D. | N.D. |
| PET + 250 nm $SiO_2$ (PHPS hydrolysis) | 1.5 +/− 0.5 | 2 | 2 | 1.45 +/− 0.01 |
| PET + 600 nm $SiO_2$ (PHPS hydrolysis) | 1.5 +/− 0.5 | 3.5 +/− 0.5 | 6 +/− 2 | 1.45 +/− 0.01 |
| PET + 50 nm $SiO_2$ VUV | 1.2 +/− 0.2 | N.D. | N.D. | 1.46 |

N.D. means "not determined".

In table 1 it can be seen that the improvement of the barrier properties of the ET through the addition of a 250 nm or 600 nm layer of SiO$_2$ is much less than the improvement procured by structures S1 and to an even greater extent structure S2. Similarly, the production of a 50 nm layer of SiO2 by VUV radiation in the atmospheric conditions described above, but outside the ranges of thicknesses of the invention, does not enable satisfactory barrier properties to be obtained since mechanical accommodation layer B is absent.

S2 according to the present invention has greatly improved gas barrier properties compared to structures having only one substrate and one silica layer.

When curves I and II are compared an improvement of the gas barrier properties due to the invention may be seen.

When curves II and III are compared, a significant reduction of the water flow is observed, said reduction being substantially greater than that which may be expected in the case of a simple addition of the properties of two gas barriers of the two bilayers. Indeed, in structure S1 the water flow attains 0.35 g·m$^{-2}$·j$^{-1}$, and in the case of structure S2 the water flow attains 0.06 g·m$^{-2}$·j$^{-1}$.

The most remarkable property is the substantial increase of the measurement stabilisation time (time lag) of structure S2 compared to structure Si, since in the case of structure S1 the stabilisation time is 1.8 hours, and in the case of structure S2 it is 1,000 hours, meaning that the time is therefore multiplied by a factor of over 500.

Layer B2 has high tenacity and density; its density, which is lower than that of layer A2, is however greatly superior to that of the polymer substrate.

Layer B2 included between layer A1 and layer A2 thus slows the progress of the gases through layers A1 and A2.

A structure with more than two bilayer stacks may be envisaged, and any number n of bilayer stacks is conceivable, where n is a positive integer. The effect on the improvement of the gas barrier is increased still further. The layers of each stack have relative thicknesses and a Young's modulus as described above.

Structure S2 may be produced by repeating the method for producing structure S1. The layer of SiO$_2$ of structure S1 is covered with an inorganic precursor of the perhydropolysilazane type; it is converted by means of VUV and UV radiation of wavelengths equal to those described above; the deposition of the second bilayer stack may be accomplished in one step in an atmosphere satisfying the conditions stipulated above.

In FIG. 4 another example of a structure S3 according to the invention may be seen. Structure S3 includes structure S1 of FIG. 1 and a layer 4 made of a polymer material; this material may be identical or different to that of substrate 2.

As a variant, layer 4 may be produced with hybrid materials such as organosilanes.

In addition to a gas barrier structure S4 may form a barrier to other elements, for example to UV rays. It may form a heat sealable barrier or a barrier with an additional function: for example, it may form a printing area.

Due to layer B problems of a mechanical nature when layer of polymer material 4 is deposited are limited, such as the curvature of the stack assembly.

Layer 4 is for example deposited in solution and then by evaporation and/or polymerisation if this is required.

In FIG. 5, a structure S4 may be seen which is a combination of structure S2 and structure S3, in which stack E2 of layers A2 and B2 is produced on polymer material layer 4, where layer B2 of the SiO$_x$N$_y$H$_z$ type is deposited on polymer material layer 4.

As with structure S2, the thicknesses of layers A1 and A2, and B1 and B2 respectively may be identical or different.

Polymer material layer 4 may improve the mechanical adaptation effect provided by layer B2 and/or contribute other specific properties, for example flexibility of the assembly, or anti-UV or moisture-absorbing properties.

Structure S4 offers functional properties, in particular gas barriers similar to those of structure S2.

The method of production of structure S4 includes the production of structure 3 and the method of production of structure S1 on layer 4.

Structures may be designed which have n bilayer stacks E$_i$ and n−1 polymer layers 4, for which the number of functional properties is increased due to the fact that n dense SiO$_2$ layers A$_i$ and n−1 interposition layers made of polymer material are positioned in series.

The structure according to the invention deposited on a substrate made of a polymer material offers improved gas barrier properties and may be transparent. Such a level of impermeability may not be obtained by conventional deposition technologies, such as physical vapour deposition, chemical vapour deposition or sputtering. In addition, the method of deposition by wet means enables the cost of the method to be limited, and also enables membranes to be produced which form very effective, low-cost gas barriers, unlike technologies using vacuum chambers, such as atomic layer deposition (ALD) or the Barix® method of the company VITEX.

The structure formed by the polymer substrate and the stack according to the low-cost invention may be used as protection for devices which are atmospherically sensitive, and in particular sensitive to water and to oxygen, such as organic electronic devices (OLED, OTFT), thin-film solar devices (CIGS), or again, more generally, to produce containers for contents which are sensitive to moisture. The low cost of such a structure means that it may be used in a very wide variety of fields.

The invention claimed is:

1. A multilayer structure, comprising a substrate, and a first stack of a SiO$_2$ layer and a SiO$_x$N$_y$H$_z$ layer positioned between the substrate and SiO$_2$ layer,
   wherein
   the SiO$_2$ layer has a thickness of less than or equal to 60 nm,
   the SiO$_x$N$_y$H$_z$ layer has a thickness of more than twice the thickness of the SiO$_2$ layer,
   the thicknesses of the SiO$_2$ layer and the SiO$_x$N$_y$H$_z$ layer total from 100 nm to 500 nm, and
   z is strictly positive and is strictly less than a ratio (x+y)/5,
   wherein the value of x decreases from an interface between the SiO$_x$N$_y$H$_z$ layer and the SiO$_2$ layer towards the substrate, and the value of y increases from the interface between the SiO$_x$N$_y$H$_z$ layer and the SiO$_2$ layer towards the substrate,
   wherein x varies from 2 to 0 and y varies from 0 to 1, and
   wherein the SiO$_2$ layer and the SiO$_x$N$_y$H$_z$ layer are made of amorphous materials.

2. The multilayer structure according to claim 1, wherein z is strictly less than a ratio (x+y)/10.

3. The multilayer structure according to claim 1, wherein a material of the SiO$_2$ layer has a Young's modulus of greater than or equal to 30 GPa, and a material of the SiO$_x$N$_y$H$_z$ layer has a Young's modulus of less than or equal to 20 GPa.

4. The multilayer structure according to claim 1, wherein the stack has a refractive index of greater than 1.5.

5. The multilayer structure according to claim 3, wherein the stack is obtained by conversion of a liquid containing a perhydropolysilazane, where the stack has a transmittance corresponding to a Si—H bond of greater than 80% of a transmittance of the Si—H bond of the liquid containing the perhydropolysilazane before conversion, measured by infrared reflectance spectrometry in the case of a substrate made of polymer material.

6. The multilayer structure according to claim 5, wherein the stack has a transmittance corresponding to the Si—H bond of greater than 90% of the transmittance of the Si—H bond of the inorganic precursor of the perhydropolysilazane before conversion, measured by infrared reflectance spectrometry in the case of a substrate made of polymer material.

7. The multilayer structure according to claim 3, wherein the stack is obtained by conversion of an inorganic precursor of a perhydropolysilazane, where the stack has an absorbance corresponding to a Si—H bond of less than 20% of an absorbance of the Si—H bond of the inorganic precursor of the perhydropolysilazane before conversion, measured by infrared transmission spectrometry in the case of a silicon substrate.

8. The multilayer structure according to claim 7, wherein the stack has an absorbance corresponding to the Si—H bond of less than 10% of the absorbance of the Si—H bond of the liquid containing the perhydropolysilazane before conversion, measured by infrared transmission spectrometry in the case of a silicon substrate.

9. The multilayer structure according to claim 1, wherein the substrate is made of a polymer material.

10. The multilayer structure according to claim 1, further comprising a layer of polymer material on the $SiO_2$ layer of the first stack on a face opposite the one in contact with the $SiO_xN_yH_z$ layer.

11. The multilayer structure according to claim 1, comprising n stacks, wherein
n is a positive integer greater than or equal to 1,
each stack comprises a $(SiO_2)_i$ layer and a $SiO_{xi}N_{yi}H_{zi}$ layer,
i is a positive integer of between 1 and n,
the $(SiO_2)_i$ layers of each stack have a thickness of less than or equal to 60 nm,
the $SiO_{xi}N_{yi}H_{zi}$ layers of each stack have a thickness of more than twice the thickness of the $(SiO_2)_i$ layers,
the thicknesses of the $(SiO_2)_i$ layers and the $SiO_{xi}N_{yi}H_{zi}$ layers total from 100 nm to 500 nm, and
$z_i$ is strictly less than a ratio $(x_i+y_i)/5$.

12. The multilayer structure according to claim 11, wherein $z_i$ is strictly less than a ratio $(x_i+y_i)/10$, where $x_i$, $y_i$ and $z_i$ may or may not be identical for different values of i.

13. The multilayer structure according to claim 12, comprising at least one layer made of polymer material positioned between the $(SiO_2)_i$ layer of a stack and the $SiO_{xi}N_{yi}H_{zi}$ layer of the stack which follows directly.

14. The multilayer structure according to claim 13, comprising n−1 layers made of polymer material, where each of the layers made of polymer material is positioned between two stacks.

15. The multilayer structure according to claim 4, wherein the stack is obtained by conversion of a liquid containing a perhydropolysilazane, where the stack has a transmittance corresponding to a Si—H bond of greater than 80% of a transmittance of the Si—H bond of the liquid containing the perhydropolysilazane before conversion, measured by infrared reflectance spectrometry in the case of a substrate made of polymer material.

16. The multilayer structure according to claim 4, wherein the stack is obtained by conversion of a liquid containing a perhydropolysilazane, where the stack has an absorbance corresponding to the Si—H bond of less than 20% of an absorbance of the Si—H bond of the liquid containing the perhydropolysilazane before conversion, measured by infrared transmission spectrometry in the case of a silicon substrate.

17. The multilayer structure according to claim 13, wherein the substrate is a polymer material of a polyester selected from the group consisting of polyethylene terephthalate and polyethylene naphthalate.

18. The multilayer structure according to claim 13, wherein the substrate is a polymer material of a polyolefin selected from the group consisting of polyethylene and polypropylene.

19. The multilayer structure according to claim 13, wherein the substrate is a polymer material of a polyamide.

20. The multilayer structure according to claim 1, wherein the $SiO_2$ layer and the $SiO_xN_yH_z$ layer are in close contact along their entire surfaces and wherein each of the layers contains only one material.

21. The multilayer structure according to claim 1, wherein the thicknesses of the $SiO_2$ layer and the $SiO_xN_yH_z$ layer total from 100 nm to 250 nm.

22. A method for producing a multilayer structure according to claim 1,
the method comprising:
depositing a liquid containing a perhydropolysilazane on a substrate; and
converting by irradiation by VUV radiation with a wavelength of less than or equal to 220 nm and an ultraviolet radiation with a wavelength of greater than or equal to 220 nm in an atmosphere with an oxygen content of greater than 10 ppm and less than 500 ppm and a water content of less than or equal to 1,000 ppm, so as to form a stack of a $SiO_2$ layer and a $SiO_xN_yH_z$ layer.

23. The method according to claim 22, further comprising further depositing a layer of polymer material after the converting.

24. The method according to claim 22, further comprising repeating the depositing and converting.

25. A method for producing a multilayer structure according to claim 1,
the method comprising:
depositing a liquid containing perhydropolysilazane on a substrate;
converting by irradiation by ultraviolet radiation with a wavelength of greater than 220 nm in an atmosphere having an oxygen content and a water content of less than 10 ppm to obtain a converted layer;
depositing a liquid containing the perhydropolysilazane on the converted layer; and
converting by irradiation by VUV radiation with a wavelength of less than or equal to 220 nm in an atmosphere having an oxygen content of greater than 10 ppm and less than 500 ppm.

26. A method for improving gas barrier properties of a substrate, the method comprising depositing the multilayer structure according to claim 1 on the substrate comprising a polymer material.

27. The method according to claim 23, further comprising repeating the depositing, converting, and further depositing.

* * * * *